United States Patent [19]

Yamakido

[11] Patent Number: 4,945,359
[45] Date of Patent: Jul. 31, 1990

[54] A/D CONVERTER

[75] Inventor: Kazuo Yamakido, Hinode, Japan

[73] Assignee: Hitachi, Ltd., Tokyo, Japan

[21] Appl. No.: 326,743

[22] Filed: Mar. 21, 1989

[30] Foreign Application Priority Data

Mar. 25, 1988 [JP] Japan .................. 63-69447

[51] Int. Cl.⁵ .............................................. H03M 1/12
[52] U.S. Cl. .................................... 341/143; 341/122; 341/155
[58] Field of Search ................. 341/51, 122, 143, 155, 341/158, 163

[56] References Cited

U.S. PATENT DOCUMENTS

| | | | |
|---|---|---|---|
| 4,017,849 | 4/1977 | Tewksbury | 341/143 |
| 4,384,278 | 5/1983 | Benjamin | 341/143 |
| 4,588,981 | 5/1986 | Senn | 341/143 |
| 4,672,361 | 6/1987 | Kokubo et al. | 341/141 |
| 4,704,600 | 11/1987 | Uchimura et al. | 341/144 |
| 4,772,871 | 9/1988 | Suzuki et al. | 341/155 |
| 4,789,862 | 12/1988 | Jackson | 341/155 |
| 4,876,542 | 10/1989 | van Bavel et al. | 341/143 |

OTHER PUBLICATIONS

ICASSP 85, Proc. Technical Papers, 36.7.1–36.7.4 (1985), pp. 1400–1403.
ISSCC 86, Dig. Technical Papers, THPM 14.6 (1986), pp. 182–183.
ISSCC 87, Dig. Technical Papers, WAM 3.5 (1987), pp. 48–49.

Primary Examiner—William M. Shoop, Jr.
Assistant Examiner—Gary J. Romano
Attorney, Agent, or Firm—Antonelli, Terry, Stout & Kraus

[57] ABSTRACT

Herein disclosed is an oversampling type A/D converter, wherein there are connected in multiple stages units interpolation type A/D conversion circuits each including: an analog integration circuit for integrating the difference between an analog input signal and a feedback signal; a voltage comparison circuit for adding the integrated signal and said difference to produce a digital signal on the basis of the added value; a digital integration circuit for integrating the digital signal coming from the voltage comparison circuit; a feedback load D/A conversion circuit for producing a feedback signal from the output of the digital integration circuit; and an addition circuit for adding the output and input of said digital integration circuit.

11 Claims, 5 Drawing Sheets

A/D CONVERTER

BACKGROUND OF THE INVENTION

The present invention relates to an A/D converter for converting analog signals to digital signals and, more particularly, to a technique which is effective when used in an oversampling type A/D converter contained in a communication LSI for processing speech band signals, such as a MODEM LSI, an echo canceller LSI or CODEC LSI.

The oversampling type A/D converter relaxes the accuracy of an analog element formed in the A/D converter, to realize the desired conversion accuracy by using a sufficiently high sampling frequency for the Nyquist frequency (i.e., the double frequency of a signal frequency bandwidth). This A/D converter is classified into several types depending upon the combination of integration circuits contained in the main and feedback paths of signals, as disclosed in ICASSP 85, Proc. Technical Papers, 36.7.1 to 36.7.4 (1985), pp. 1400 to 1403.

Of these, the delta-sigma type A/D converter has no integration circuit in its feedback path to produce one bit/sample digital output on principle. In this type, the feedback signal from the D/A converter constructed takes positive or negative reference voltages equal to the maximum coding amplitude. If the voltage change of an analog input signal between two consecutive samples increases, there arises a phenomenon called the "gradient overload" that the follow-up response becomes the worse to deteriorate the S/N ratio for the larger number of conversion bits of the D/A converter. Since, however, the aforementioned D/A converter has one conversion bit, it has the frequency of the analog input signal free from that gradient overload, i.e., the maximum gradient overload frequency.

On the contrary, however, the quantization noise per one sample is high so that a higher sampling frequency has to be used for conversion characteristics of high accuracy, i.e., for a high S/N ratio. In the analog integration circuit formed with the aforementioned delta-sigma type A/D converter, therefore, the maximum signal amplitude has to be integrated at a high speed and in a high accuracy to impose strict characteristics upon an analog element such as an arithmetic amplifier.

Thus, it has been proposed to improve the frequency characteristics of the quantization noise thereby to suppress the increase in the sampling frequency by cascading a plurality of stages of the delta-sigma type A/D converters, as disclosed in ISSCC 86, Dig. Technical Papers, THPM 14.6 (1986), pp. 182 to 183, and ISSCC 87, Dig. Technical Papers, WAM 3.5 (1987) pp. 48 and 49.

SUMMARY OF THE INVENTION

Our investigations have revealed that there are still left problems that the requirement for the characteristics of the analog elements such as the operational amplifier of the analog integration circuit constructed in the aforementioned delta-sigma A/D converter is relaxed but insufficiently, and that the digital signal processor for processing the outputs of the individual stages is large-scaled.

An object of the present invention is to provide an A/D converter of wide range and high accuracy, which has a high S/N ratio while sufficiently relaxing the requirement for the characteristics of the analog integration circuit or the operational amplifier.

The foregoing and other objects and the novel features of the present invention will become apparent from the following description taken with reference to the accompanying drawings.

The representative concept of the present invention will be disclosed hereinafter. As in Japanese Patent Laid-Open No. 61-65626 (which corresponds to U.S. Pat. No. 4,672,361), for example, there is disclosed an interpolation type A/D converter which comprises: an analog integration circuit for integrating the difference between an analog input signal and a feedback signal; a voltage comparison circuit for adding the integrated signal and said difference to produce a digital signal on the basis of the added value; a digital integrator for integrating the digital signal coming from the voltage comparison circuit; and a feedback local D/A converter for producing a feedback signal from the output of the digital integration circuit, which converter is characterized in that there are cascaded a plurality of unit A/D conversion circuits each composed of an A/D converter which is equipped as its outputs with not only the first digital output coming from the output of the aforementioned digital integration circuit like the prior art, but also an analog output coming from the output of the aforementioned analog integration circuit, a second digital output coming from the input of the aforementioned digital integration circuit, and a third digital output for outputting the arithmetically added value of said first and second digital outputs.

According to the above-specified means, the interpolation type A/D converter is used as the unit A/D conversion circuit, that is to say, the conversion bit number of the feedback local D/A conversion circuit is in plurality, so that the requirement for the characteristics of the analog element such as the analog integration circuit or the operational amplifier circuit is loose. In the case of the cascade connection, moreover, the noise shaping coefficient obtained has an order equal to the number of cascade steps, although the interpolation type A/D converter has a noise shaping coefficient of one order. As a result, a high S/N ratio can be obtained even if the bit number of the components of the feedback local D/A conversion circuit of the aforementioned unit A/D conversion circuit is so small that the quantization noises are relatively high. In this case, moreover, the band can be widened because the gradient overload frequency is raised.

DESCRIPTION OF THE PREFERRED EMBODIMENTS

Figure 1:
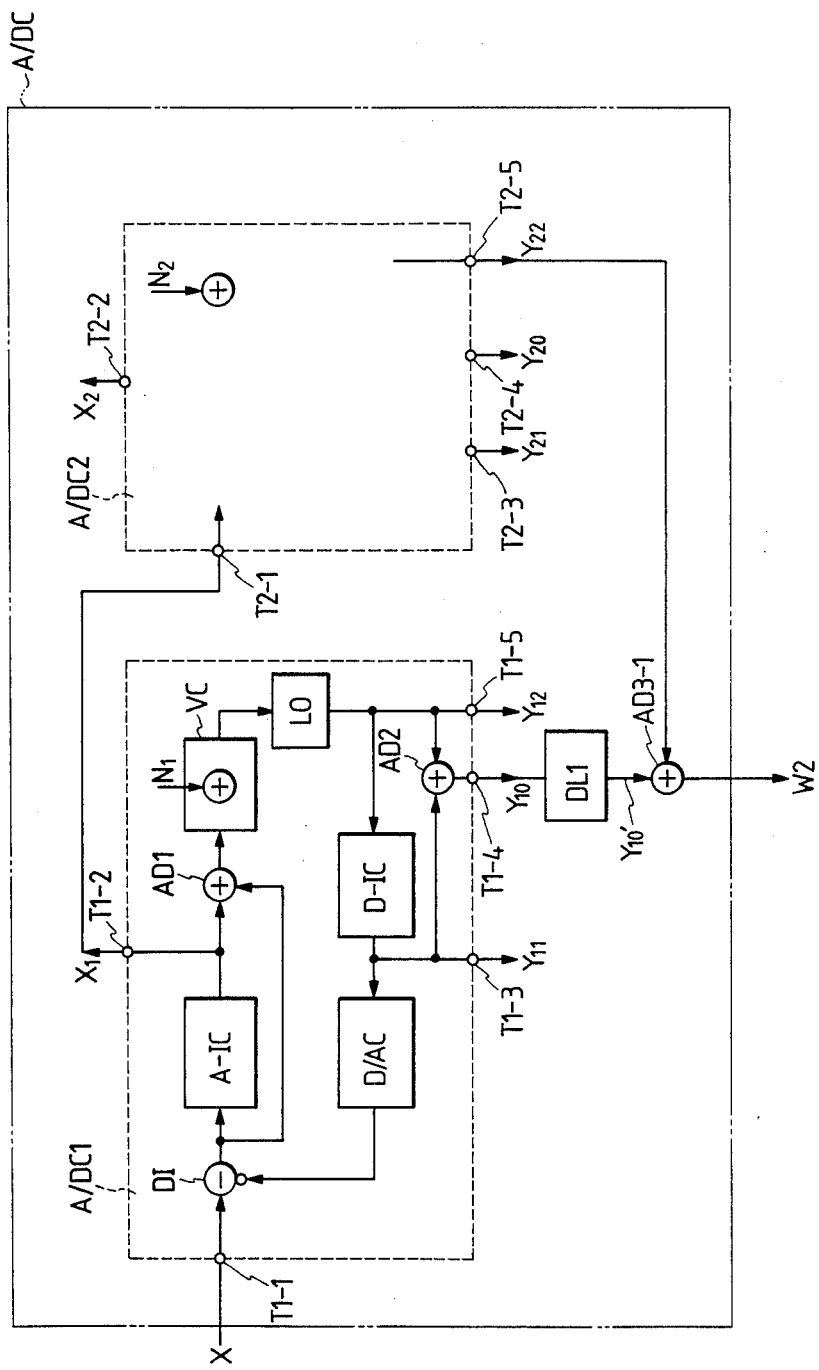
FIG. 1 is a block diagram showing a first embodiment of an oversampling type A/D converter according to the present invention.
Figure 6:
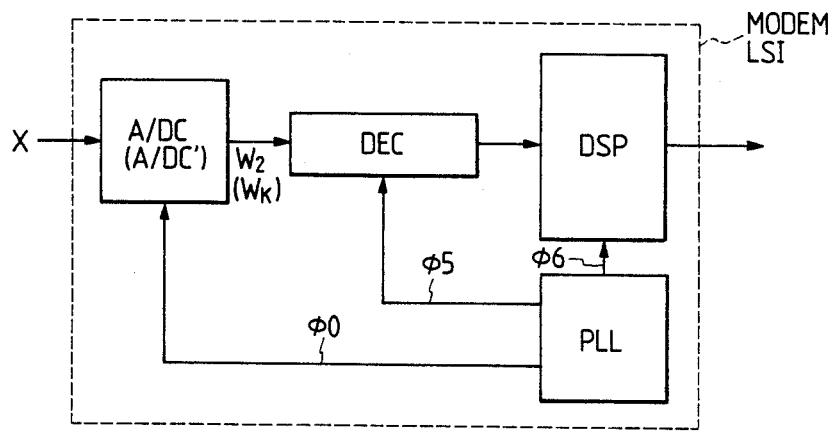
FIG. 6 is a block diagram showing a MODEM LSI containing the oversampling type A/D converter according to the present invention.

FIG. 1 is a block diagram showing a first embodiment of an oversampling type A/D converter according to the present invention. FIG. 6 is a block diagram showing a MODEM LSI to which is applied the oversampling type A/D converter A/DC (A/DC') shown in FIG. 1 or 5. In the following Drawings, the parts designated at identical reference characters have identical structures.

In FIG. 6, the MODEM LSI is assumed to be constructed of: an oversampling type A/D converter (which will be referred to hereinafter simply as an "A/D converter") A/D (A/DC') for A/D converting an analog input signal X on the basis of a timing signal $\phi0$; a decimator circuit DEC for extracting the digital output signal $W_2$ ($W_k$) of the A/D converter A/DC (A/DC') in accordance with a timing signal $\phi5$; a digital signal processor DSP for processing the output signal of the decimator circuit DEC in a predetermined manner in accordance with a timing signal $\phi6$; a PLL (i.e., Phase Locked Loop) circuit PLL for producing the timing signals $\phi0$ and $\phi5$; and other not-shown circuit elements. The MODEM LSI thus constructed is formed over one semiconductor substrate of single-crystal silicon, although not limitative thereto, by the technique for fabricating a semiconductor integrated circuit. Here, the A/D converter A/DC is that shown in FIG. 1 whereas the A/D converter A/DC' is that shown in FIG. 5, and the digital output signals $W_2$ and $W_k$ are the output signals of the A/D converters A/DC and A/DC', respectively.

In FIG. 1, the A/D converter A/DC is constructed of: unit interpolation type A/D conversion circuits (which will be referred to hereinafter as "unit A/D conversion circuits") A/DC1 and A/DC2; a delay circuit DL1 for delaying the digital output signal $Y_{10}$ of the unit A/D conversion circuit A/DC1 by one sampling period; and an addition circuit AD3-1 for adding the output signal $Y10'$ of the delay circuit DL1 and the digital output signal $Y_{22}$ of the unit A/D conversion circuit A/DC2.

The unit A/D conversion circuits A/DC1 and A/DC2 have identical constructions, and only the structure of the unit A/D conversion circuit A/DC1 is shown as representative in FIG. 1. The unit A/D conversion circuit A/DC1 is composed of a differential circuit DI, an analog integration circuit A-IC, addition circuits AD1 and AD2, a voltage comparison circuit VC, a logical circuit LO, a digital integration circuit D-IC, a local D/A conversion circuit D/AC, an input terminal T1-1 and output terminals T1-2 to T1-5.

In the unit A/D conversion circuit A/DC1, the differential circuit DI detects an error voltage between the analog input signal X fed from not-shown filter and hybrid circuit through the input terminal T1-1 and a feedback signal coming from the local D/A conversion circuit D/AC and feeds the detected output signal to the analog integration circuit A-IC and the addition circuit AD-1. The analog integration circuit A-IC adds the output signal of the differential circuit DI and the error voltage till the preceding sampling period by its integrating operation and feeds the added output signal to the addition circuit AD-1. This addition circuit AD-1 adds the output signal of the analog integration circuit A-IC and the output signal of the differential signal DI and feeds the added output signal to the voltage comparison circuit VC. Here, the reason why the output signal of the analog integration circuit A-IC indicating the error voltage and the output signal of the differential circuit DC are added again by the addition circuit AD-1 is to give the circuit stabilizing operation and the primary predicting effect. The voltage comparison circuit VC determines the polarity and level of the output signal coming from the addition circuit AD1 and feeds its output signal to the logical circuit LO. Here, the voltage comparison circuit operates to convert an analog signal to a digital signal so that its output signal contains a signal output of a gain 1 and a quantization noise voltage $N_1$. The logical circuit LO is one for converting the output signal of the voltage comparison circuit VC to a signal indicating a complement of 2 and is suitable for the digital signal processing and feeds its output signal to the digital integration circuit D-IC. This digital integration circuit D-IC integrates the output signal of the logical circuit LO and feeds its output signal to the local D/A conversion circuit D/AC. This local D/A conversion circuit D/AC converts the output signal coming from the digital integration circuit D-IC to an analog signal and feeds its output signal as a comparison feedback signal for the sample value of the subsequent analog input signal X to the differential circuit DI. Incidentally, the operations of these circuits are accomplished in a predetermined manner in accordance with the timing signals coming from a timing signal generation circuit TG, as will be described hereinafter.

The unit A/D conversion circuit A/DC1 of the present embodiment is further equipped with the addition circuit AD2, as has been described hereinbefore. This addition circuit AD2 adds the output signals of the logical circuit LO and the digital integration circuit D-IC. Moreover, the unit A/D conversion circuit A/DC1 of the present invention is further equipped with the aforementioned output terminals T1-2 to T1-5 for outputting: the output signal of the analog integration circuit A-IC as an analog output signal $X_1$; the output signal of the digital integration circuit D-IC as a digital output signal $Y_{11}$; the output signal of the digital integration circuit D-IC as a digital output signal $Y_{12}$; and the output signal of the addition circuit AD2 as a digital output signal $Y_{10}$. The analog output signal $X_1$ is fed as the analog input signal of the unit A/D converter A/DC2 through the output terminal T1-2 to the input terminal T2-1. The digital output signal $Y_{10}$ is fed through the output terminal T1-4 to the delay circuit DL1.

The unit A/D conversion circuit A/DC2 is made to have the structure identical to that of the unit A/D conversion circuit A/DC1, as has been described hereinbefore, and performs operations similar to those of the unit A/D conversion circuit A/CD1 by using the analog output signal $X_{11}$ as its analog input signal. The unit A/D conversion circuit A/DC2 has its output terminals T2-2, T2-3, T2-4 and T2-5 corresponding to those T1-2, T1-3, T1-4 and T1-5 of the unit A/D conversion circuit A/DC1, respectively, and is so constructed as to output similar output signals. Specifically, although not shown, the unit A/D conversion circuit A/DC2 can output: the output signal of the analog integration circuit A-IC contained in the unit A/D conversion circuit A/DC2 as an analog output signal $X_2$; the output signal of the digital integration circuit D-IC as a digital output signal $Y_{21}$; the input signal of the digital integration circuit D-IC as a digital output signal $Y_{22}$; and the output signal of the adder AD2 as a digital output signal $Y_{20}$. The digital output signal $Y_{22}$ is fed to the addition circuit AD3-1 Incidentally, reference characters $N_2$ designate the quantization noise voltage of the unit A/D conversion circuit A/DC2, which is added to the output signal of the not-shown voltage comparison circuit VC contained in the unit A/D conversion circuit A/DC2, although not shown.

The delay circuit DL1 delays the digital output signal $Y_{10}$ by one sampling period and feeds its output as the digital output signal $Y_{10}'$ to the addition circuit AD3-1.

This addition circuit AD3-1 adds the digital output signals $Y_{10}'$ and $Y_{22}$ and feeds its output as the digital output signal $W_2$ of the A/D converter A/DC to the decimator circuit DEC shown in FIG. 6.

The unused terminals T1-3, T1-5, T2-2, T2-3 and T2-4 of the unit A/D conversion circuits A/DC1 and A/DC2 need not be elaborately provided, although not limited especially thereto.

Figure 2:
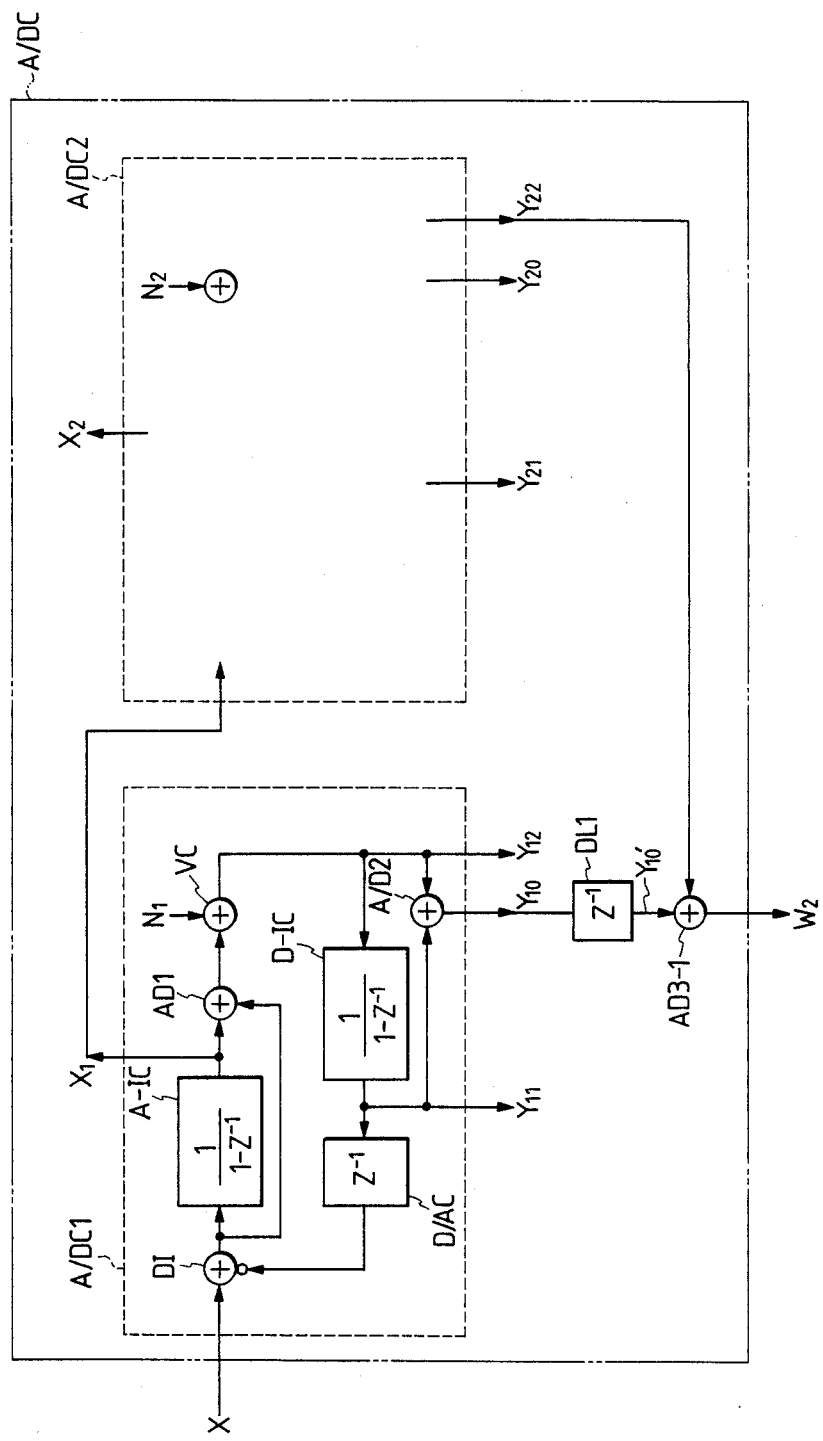
FIG. 2 is a circuit diagram showing an equivalent circuit showing a unit interpolation type A/D conversion circuit of FIG. 1 in terms of the Z function.

FIG. 2 is an equivalent circuit diagram showing the A/D converter A/DC by using the Z function so as to illustrate the operation characteristics of the A/D converter A/DC shown in FIG. 1.

In FIG. 2, the unit A/D conversion circuits A/DC1 and A/DC2 are made to have the identical constructions, as has been described hereinbefore, and only the unit A/D conversion circuit A/DC1 is shown as a representative by using the Z function. The term "$1/(1-Z^{-1})$" of the analog integration circuit A-IC and the digital integration circuit D-IC designates the integration of the sampled signal, and the term "$Z^{-1}$" of the local D/A conversion circuit D/AC and the delay circuit DL1 designates the delay of one sampling period.

The individual digital output signals $Y_{11}$, $Y_{12}$, $Y_{10}$ and $X_1$ are expressed in the form of the Z functions of the analog input signal X and the quantization noise voltage $N_1$, as follows:

$$Y_{11}=(2-Z^{-1})X+(1-Z^{-1})N_1 \qquad (1)$$

$$Y_{12}=(2-Z^{-1})(1-Z^{-1})X+(1-Z^{-1})^2N_1 \qquad (2)$$

$$Y_{10}=(2-Z^{-1})^2X+(2-Z^{-1})(1-Z^{-1})N_1 \qquad (3)$$

and $$X_1=(1-Z^{-1})X-Z^{-1}N_1 \qquad (4)$$

In these equations (1) to (4):

$$Z^{-1} = \exp\left(-j2\pi \frac{f}{fs}\right) \qquad (5)$$

wherein: exp ( ) designates an exponential function; j designates a complex number; $\pi$ designates the circle ratio; f designates the signal frequency of the analog input signal x; and fs designates the sampling frequency.

In the oversampling type A/D converter, the sampling frequency fs is far higher than the signal frequency f of the analog input signal X. Hence, $Z^{-1} \approx 1$ so that $(1-Z^{-1}) \approx 0$ and $(2-Z^{-1}) \approx 1$ in the above-defined equations (1) and (4). In the digital output signals $Y_{11}$ and $Y_{10}$, a satisfactory conversion accuracy, i.e., a high S/N ratio can be obtained as the signal—to—quantization noise power ratio. On the other hand, the A/D converter of the prior art, i.e., the interpolation type A/D converter as disclosed in Japanese Patent Laid-Open No. 61-65626 is one which is constructed by eliminating the addition circuit AD2 and the output terminals T1-2, T1-4 and T1-5 from the unit A/D conversion circuit A/DC1. The digital output signal of this interpolation type A/D converter considers the digital output signal $Y_{11}$.

Incidentally, the aforementioned $(2-Z^{-1})$ designates a transmission function of the analog input signal x, and the $(1-Z^{-1})$ designates the transmission function of the quantization noises and is called the "noise shaping coefficient (or effect)".

Incidentally, as shown in FIG. 1, the local D/A conversion circuit D/AC is constructed to have a plurality of bits for converting the output signal of the digital integration circuit D-IC as it is to an analog value. As this number of D/A conversion bits is the larger, the error from the analog input signal X is the smaller. As apparent from the foregoing equations (1) to (4), therefore, the operation signal amplitudes of the differential circuit DI, the analog integration circuit A-IC and the addition circuit AD1 are far smaller than the maximum coding amplitude. Thus, the operational amplifiers contained in the differential amplifier DI, the analog integration circuit A-IC and the addition circuit AD1 may have low operation speeds.

If, however, the frequency of the analog input signal X is raised to increase the signal voltage change of the analog input signal X of the consecutive two sampling periods, the follow-up response becomes the worse to deteriorate the S/N ratio as the local D/A conversion circuit D/AC has the larger conversion bit number. This phenomenon is called the "gradient overload phenomenon, as has been described hereinbefore, and the signal frequency $f_1$ of the analog input signal X free from the gradient overload is expressed by the following relations for the local D/A conversion bit number n:

$$f_1 \leq \frac{fs}{\pi \cdot 2^m} \qquad (6)$$

Hence, the S/N ratio is deteriorated even more for the larger local D/A conversion bit number, as described above.

In the first embodiment of the present invention, therefore, the value of m=6 to 8 bits using the speech band as an target is reduced to about 3 to 4 bits, for example, and a cascade connection of two stages is made. Here, since the analog input signal of the unit A/D conversion circuit A/DC2 is the analog output signal $X_1$ of the unit A/D conversion circuit A/DC1, the individual output signals of the unit A/D conversion circuit A/DC2 are expressed using the Z function in the following forms by substituting X, $Y_{11}$, $Y_{12}$, $Y_{10}$, and $N_1$ of the foregoing equations (1) to (4) by $X_1$, $Y_{21}$, $Y_{22}$, $Y_{20}$ and $N_2$, respectively:

$$Y_{21}=(2-Z^{-1})(1-Z^{-1})X-Z^{-1}(2-Z^{-1})N_1+(1-Z^{-1})N_2 \qquad (7)$$

$$Y_{22}=(2-Z^{-1})(1-Z^{-1})^2X-Z^{-1}(2-Z^{-1})(1-Z^{-1})N_1+(1-Z^{-1})^2N_2 \qquad (8)$$

$$Y_{20}=(2-Z^{-1})^2(1-Z^{-1})X-Z^{-1}(2-Z^{-1})^2N_1+(2-Z^{-1})(1-Z^{-1})N_2 \qquad (9)$$

and $$X_2 = (1-Z^{-1})^2 X - Z^{-1}(1-Z^{-1})N_1 - Z^{-1}N_2 \quad (10)$$

On the other hand, the signal $Y_{10}'$, which is produced by delaying the digital output signal $Y_{10}$ of the unit A/D conversion circuit A/DC1 by one sampling period by the delay circuit DL1, is expressed by the following equation:

$$Y_{10}' = (2-Z^1)^2 Z^{-1} X + (2-Z^{-1})(1-Z^{-1})Z^{-1}N_1 \quad (11)$$

Moreover, the output $W_2$, which is prepared by adding the signal $Y_{10}'$, produced by delaying the digital output signal $Y_{10}$ by one sampling period by the delay circuit DL1 and the digital output signal $Y_{22}$ of the unit A/D conversion circuit A/D2, i.e., the digital output signal of the A/D converter A/DC is expressed from the foregoing equations (8) and (11) by the following equation:

$$W_2 = (2-Z^{-1})X + (1-Z^{-1})^2 N_2 \quad (12)$$

If this equation (12) is compared with the equation (1), namely, the digital output signal of the interpolation type A/D converter of the prior art, as disclosed in Japanese Patent Laid-Open No. 61-65626, it is found that the transmission function $(2-Z^{-1})$ of the analog input signal X is common and that the noise shaping coefficient $(1-Z^{-1})$ for the quantization noise voltage has a larger order.

As has been described hereinbefore, the A/D converter A/DC is constructed of multiple stages of the unit A/D conversion circuits A/DC1 and A/DC2 to sufficiently relax the requirement for the characteristics of the analog elements such as the operational amplifiers contained in the analog integration circuit A-IC, the differential amplifier DI and the addition circuit AD1 and to attain a high S/N ratio. Moreover, the A/C converter A/DC is enabled to have a high gradient overload frequency $f_1$ and to widen the band by the multi-step connection.

Figure 3:
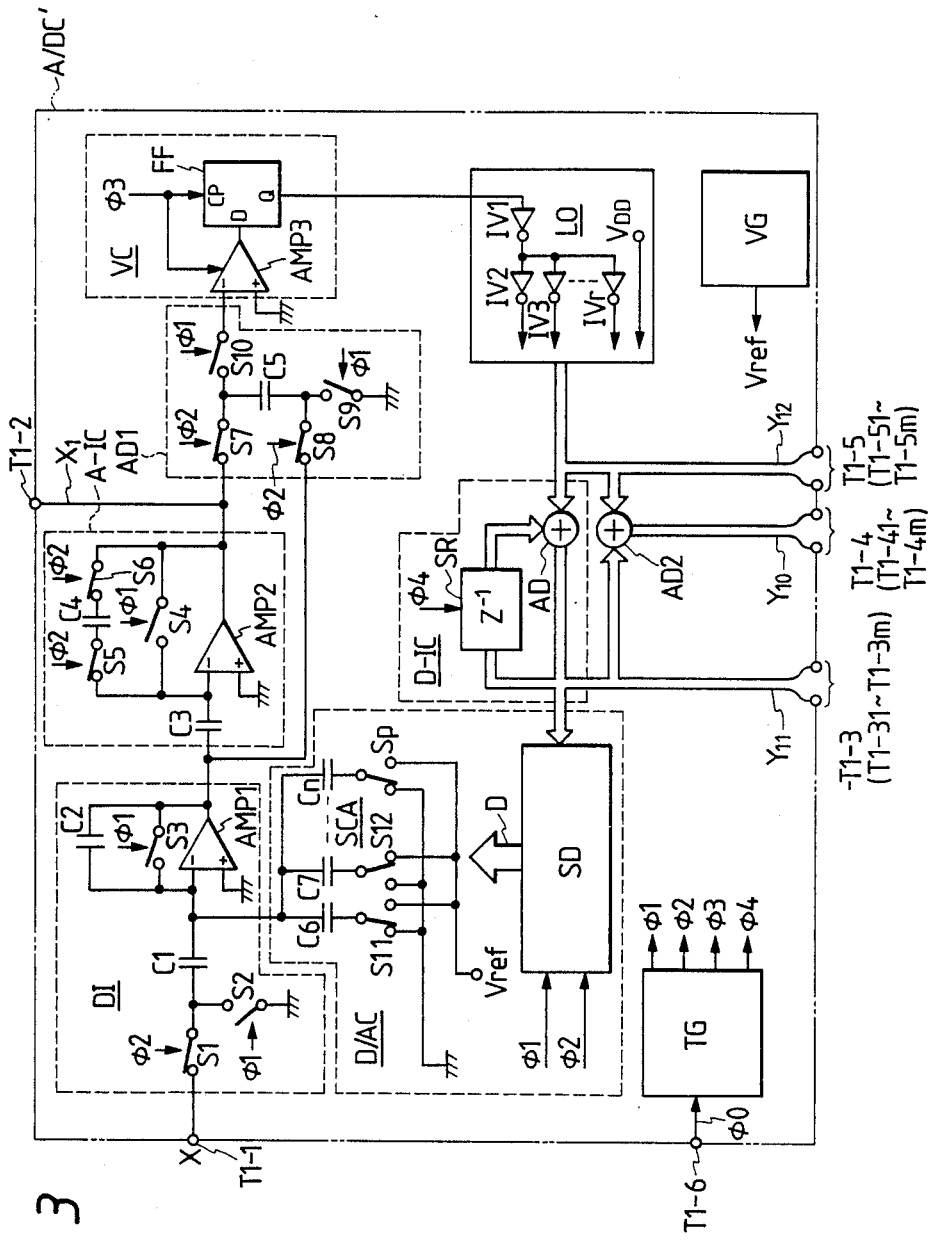
FIG. 3 is a specific circuit diagram showing the unit interpolation type A/D conversion circuit of FIG. 1.
Figure 4:
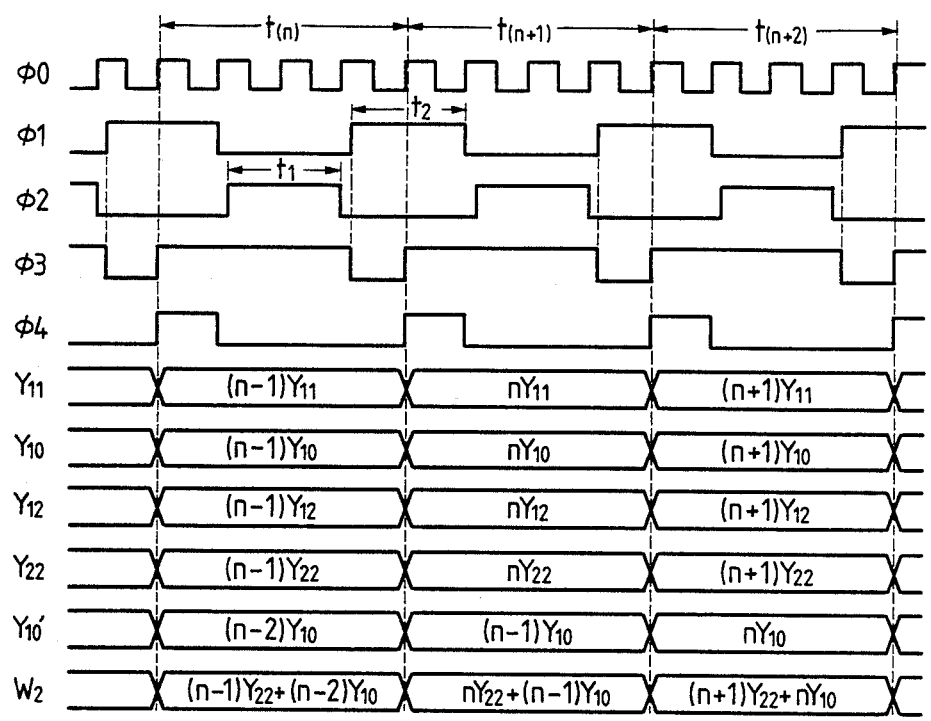
FIG. 4 is a timing chart showing one example of the operations of the unit interpolation type A/D conversion circuit of FIG. 1.

FIG. 3 is a specific circuit diagram showing the unit A/D conversion circuit A/DC1 of FIG. 1. FIG. 4 is a timing chart illustrating the circuit operations of the unit A/D conversion circuit A/DC1 of FIG. 3.

In FIG. 3, the unit A/D conversion circuit A/DC1 is further constructed, although not shown in FIG. 1, of: a timing signal generation circuit TG for producing timing signals $\phi_1$ to $\phi_4$ for controlling the operations of the circuits composing the unit A/D conversion circuit A/DC1, by dividing the frequency of the timing signal $\phi_0$ fed from the PLL circuit PLL shown in FIG. 6; input terminals T1-6 for feeding the timing signal $\phi_0$ to the timing signal generation circuit TG; and a reference voltage generation circuit VG for producing a reference voltage $V_{ref}$ and feeding it to the local D/A conversion circuit D/AC. Incidentally, the unit A/D conversion circuit A/DC2 is also to have an identical structure, as has been described hereinbefore. Moreover, the output terminals T1-3, T1-4 and T1-4 are composed of a plurality of bits, in which the digital output signals $Y_{11}$, $Y_{10}$ and $Y_{12}$ are indicated by the complements of 2. Therefore, the output terminals T1-3, T1-4 and T1-5 are designated at T1-31 to T1-3m, T1-41 to T1-4m, and T1-51 to T1-5m. The timing signal generation circuit TG and the reference voltage generation circuit VG may be disposed in the A/D converter A/DC while being shared between the unit A/D conversion circuits A/DC1 and A/DC2.

In FIG. 3, the differential circuit DI is composed of switches S1, S2 and S3, capacitors C1 and C2, and an operational amplifier AMP1. The switches S1, S2 and S3 are fed with the timing signals $\phi_2$, $\phi_1$ and $\phi_1$, respectively, from the timing signal generation circuit TG. Specifically, the switch S1 is turned on when the timing signal $\phi_2$ takes the high level, and the switches S2 and S3 are turned on when the timing signal $\phi_1$ takes the high level.

The analog integration circuit A-IC is composed of switches S4, S5 and S6, capacitors C3 and C4 and an operational amplifier AMP2. The switches S4, S5 and S6 are fed with the timing signals $\phi_1$, $\phi_2$ and $\phi_2$, respectively, from the timing signal generation circuit TG. The switch S4 is turned on when the timing signal $\phi_1$ takes the high level, and the switches S5 and S6 are turned on when the timing signal $\phi_2$ takes the high level.

The addition circuit AD1 is composed of switches S7, S8, S9 and S10 and a capacitor C5. The switches S7, S8, S9 and S10 are fed with the timing signals $\phi_2$, $\phi_2$, $\phi_1$ and $\phi_1$, respectively, from the timing signal generation circuit TG. The switches S7 and S8 are turned on when the timing signal $\phi_2$ takes the high level, and the switches S9 and S10 are turned on when the timing signal $\phi_1$ takes the high level.

The voltage comparison circuit VC is composed of an operational amplifier AMP3 and a flip-flop circuit FF, both of which are fed with the timing signal $\phi_3$ from the timing generation circuit TG. The operational amplifier AMP3 is a comparison circuit for determining the polarity and level of the output signal of the addition circuit AD1 by comparing it with the ground potential, and its comparing operation is accomplished when the timing signal $\phi_3$ is at the low level. The flip-flop circuit FF latches the output signal of the operational amplifier AMP3 when the timing signal $\phi_3$ is at the high level.

The logical circuit LO is composed of inverters IV1 to IVr and converts the output signal of the voltage comparison circuit to a parallel signal, which is indicated at the complement of 2 (e.g., $\pm \frac{1}{2}^{m-1}$ or its integer times in an analog converted value) according to the composition bit number (including the polarity in m bits, for example) of the local D/A converter D/AC to produce the digital output signal $Y_{12}$. This digital output signal $Y_{12}$ is fed to the addition circuit AD of the digital integration circuit D-IC, an addition circuit AD2 and output terminals T1-51 to T1-5m. Incidentally, letters $V_{DD}$ designate a supply voltage.

The digital integration circuit is composed of a parallel shift register SR. and a full addition circuit AD. The parallel shift register SR is fed with the timing signal $\phi_4$ from the timing signal generation circuit and holds the digital output signal $Y_{11}$ of a plurality of bits in accordance with the timing signal $\phi_4$.

The local D/A conversion D/AC is composed of: a switched capacitor array SCA composed of capacitors C6 to Cn and S11 to Sp; and a switch driver circuit SD. This switch driver circuit SD is fed with the timing signals $\phi_1$ and $\phi_2$ from the timing generation circuit TG and with the digital output signal $Y_{11}$ from the digital integration circuit D-IC to produce a signal D for turning on or off the switches S11 to Sp on the basis of the fed signals. The switched capacitor array SCA produces a comparison feedback signal for the sample value of the subsequent analog input signal X when the switches S11 to Sp are turned on or off in accordance with the signal D.

In FIG. 4, characters $t_{(n)}$ designate an n-th sampling period, and characters $t_{(n+1)}$ and $t_{(n+2)}$ designate the $(n+1)$th and $(n+2)$th sampling periods. The $(n-1)$, n and $(n+1)$ added to the individual output signals $Y_{11}$, $Y_{10}$, $Y_{12}$, $Y_{22}$ and $Y_{10}'$ designate the $(n-1)$th sampling period, the n-th sampling period and $(n+1)$th sampling period, respectively. For the period $t_1$, the analog input signal X is fed through the input terminal T1-1 so that the switch S1 is turned on, because the timing signal $\phi 2$ is at the high level, to apply an inverse polarity to the inverse input terminal of the operational amplifier AMP1 through the capacitor C1. Since the output of the local D/A conversion circuit D/AC is also connected with the inverse input terminal of the operational amplifier AMP1, the error voltage between the analog input signal X and the feedback signal of the local D/A conversion circuit is detected through the capacitor C2 at the output terminal of the operational amplifier AMP1 and is outputted to the analog integration circuit A-IC and the addition circuit AD-1.

The output signal of the operational amplifier AMP1 fed to the analog integration circuit A-IC turns on the switches S5 and S6 because the timing signal $\phi 2$ is at the high level, so that the output of the operational amplifier AMP2 is the addition of the error voltage till the $(n-1)$th sampling period stored in the capacitor C4 and the output signal of the operational amplifier AMP1. This added output is fed to the addition circuit AD1, as has been described hereinbefore, and is fed as the analog output signal of the unit A/D conversion circuit A/D1 to the input terminal T2-1 of the unit A/D conversion circuit A/D2.

The output of the operational amplifier AMP2 is added to the operational amplifier AMP2 by the addition circuit AD1 because the switches S7 and S8 are turned on by the high level of the timing signal $\phi 2$.

At this instant, the timing signal $\phi 2$ takes the low level, and the switches S1, S5, S6, S7 and S8 take the low level so that the timing signal $\phi 1$ takes the high level with a slight delay. As a result, the timing signal $\phi 3$ takes the low level.

Since the switches S2, S3, S4, S9 and S10 are turned on for the period $t_2$, the capacitors C1 and C2 start their discharges, but the capacitor C4 stores the aforementioned error voltage till the n-th sampling period. The charge of the capacitor C5 is fed as the output signal of the addition circuit AD1 to the operational amplifier AMP3 to be used as a comparison circuit. Here, the determining operations of the operational amplifier AMP3 are accomplished while the timing signal $\phi 3$ is at the low level.

As the timing signal $\phi 3$ rises to the high level, the signal determined by the operational amplifiers AMP3 is latched in the flip-flop circuit FF. This latched signal is fed as the output signal of the voltage comparison circuit VC to the logical circuit LO and is converted to a parallel signal indicated by the complement of 2. This converted signal is the digital output signal $nY_{12}$ of the sampling period $t_{(n)}$.

The digital output signal $nY_{12}$ of the n-th sampling period $t_{(n)}$ is fed to the addition circuit AD2, the full addition circuit AD and the output terminals T1-51 to T1-5m. Here, since the timing signal $\phi 4$ has risen to the high level, the parallel shift register SR latches the digital output signal $(n-1)Y_{12}$ of the $(n-1)$th sampling period $t_{(n-1)}$. The output signal of the shift register SR produced by its latching operation and the digital output signal $nY_{12}$ of the n-th sampling period $t_{(n)}$ are added by the full addition circuit AD to produce the digital output signal $nY_{11}$ of the n-th sampling period $t_{(n)}$. Moreover, the digital output signal $nY_{11}$ is fed to the full addition circuit AD, the switched driver circuit SD and the output terminals T1-31 to T1-3m and is added to the digital output signal $nY_{12}$ by the addition circuit AD2 to produce the digital output signal $nY_{10}$ of the n-th sampling period $t_{(n)}$. This digital output signal $nY_{10}$ is fed through the output terminals T1-4 to T1-4m to the aforementioned delay circuit DL1.

Moreover, the digital output signal $nY_{11}$ produces signals D for switching the switches S11, S12 to Sp by the switch driver circuit SD together with the timing signals $\phi 1$ and $\phi 2$. On the basis of the output signals D of the switch driver circuit SD, the switches S11 and S23 to Sp are connected with either the ground potential or the reference voltage $V_{ref}$ to produce the feedback signal or the output signal of the local D/A conversion circuit D/AC.

The digital output signal $nY_{10}$ of the n-th sampling period $t_{(n)}$ is delayed through the delay circuit DL1 to the digital output signal $Y_{10}'$, i.e., $(n-1)Y_{10}$ by one sampling period and is fed to the addition circuit AD3-1 so that it is added to the digital output signal $nY_{22}$ fed from the unit A/D conversion circuit A/DC2 of the n-th sampling period to the addition circuit AD3-1. The resultant added signal $[nY_{22}+(n-1)Y_{10}]$ is fed as the digital output signal of the A/D converter A/DC to the aforementioned decimator circuit DEC.

Figure 5:
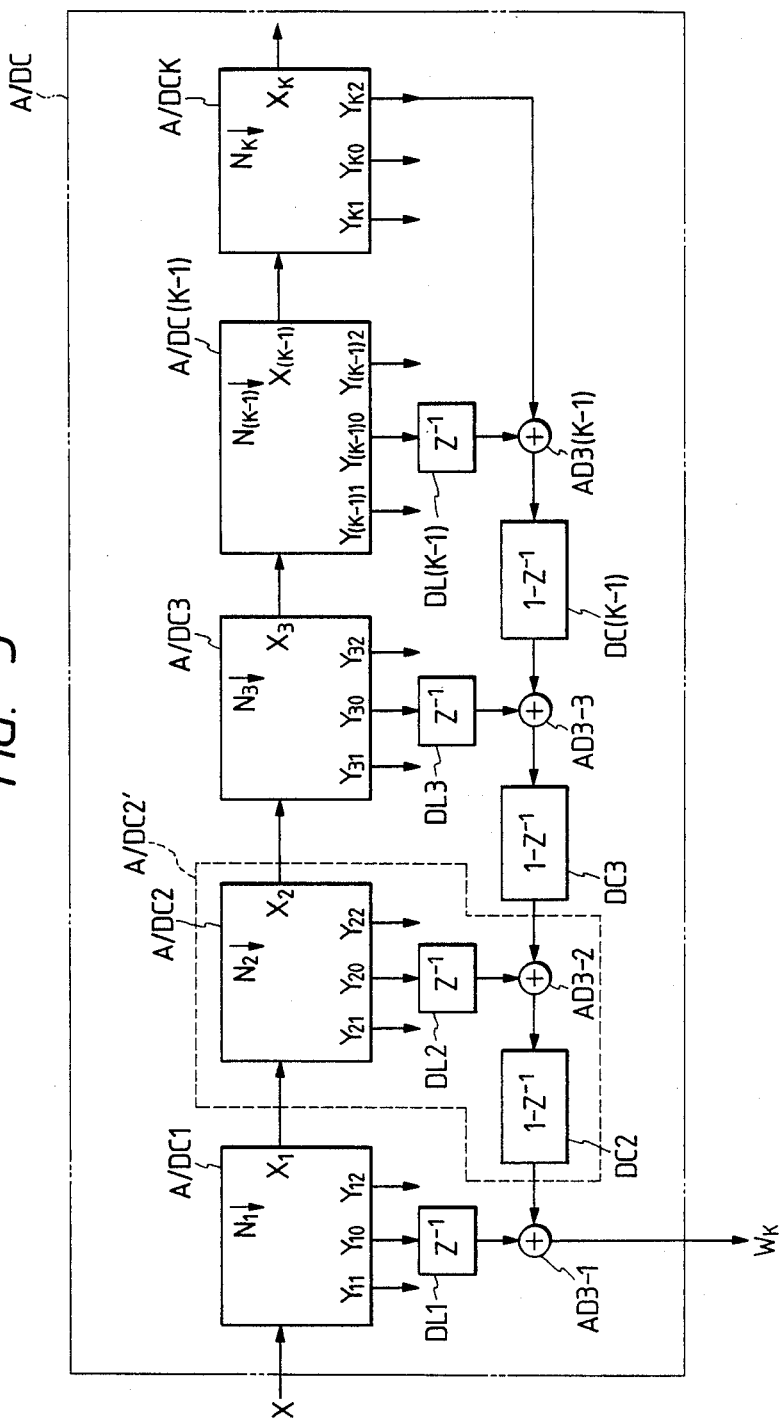
FIG. 5 is a block diagram showing a second embodiment of the oversampling type A/D converter according to the present invention.

FIG. 5 is a block diagram showing a second embodiment of the A/D converter according to the present invention.

In FIG. 5, the A/D converter A/DC' is used as the A/D converter A/DC' contained in the MODEM LSI of FIG. 6, as has been described hereinbefore.

The description will stress the difference from the A/D converter A/DC shown in FIG. 1. The A/D converter A/DC' of the present embodiment is constructed of: a cascade of k steps of unit A/D conversion circuits A/DC1, A/DC2, A/DC3 to A/DC$(k-1)$ and A/DCk; a $(k-1)$ number of delay circuits DL1, DL2 and DL3 to DL$(k-1)$; a $(k-1)$ number of addition circuits AD3-1, AD3-2 and Ad3-3 to AD3$(k-1)$; and a $(k-2)$ number of differential circuits DC2 and DC3 to DC$(k-1)$. The A/D converter A/DC is not composed of a cascade of two stages of the unit A/D conversion circuits A/DC1 and A/DC2, but is composed of a cascade of k steps of unit A/D conversion circuits A/DC1 to A/DCK. Incidentally, the $(k-1)$ number of unit A/D conversion circuits A/DC2 to A/DC$(k-1)$ and A/DCK are made to have the structures identical to that of the unit A/D conversion circuit A/DC1. Analog output signals $X_3$ to $X_{(k-1)}$ and $X_k$ correspond to the analog output signal $X_1$; digital output signals $Y_{31}$ to $Y_{(k-1)1}$ and $Y_{k1}$ correspond to the digital output signal $Y_{11}$; digital output signals $Y_{30}$ to $Y_{(k-1)0}$ and $Y_{k0}$ correspond to the digital output signal $Y_{10}$; and digital output signals $Y_{32}$ to $Y_{(k-1)2}$ and $Y_{k2}$ correspond to the digital output signal $Y_{12}$.

In FIG. 5, the unit A/D conversion circuit A/DC1 receives the analog input signal X like FIG. 1 and accomplishes predetermined operations to produce the analog output signal $X_1$ and the digital output signals $Y_{11}$, $Y_{10}$ and $Y_{12}$. Of these output signals, the analog output signal $X_1$ is fed as the analog input signal of the unit A/D conversion circuit A/DC2 of the subsequent step, and the digital output signal $Y_{10}$ is fed to the delay circuit DL1. The cascade of (k−1) steps of unit A/D conversion circuits A/DC2, A/DC3 to A/DC(k−1) and A/DCK receive the analog output signals $X_1$, $X_2$ and $X_3$ to $X_{(k-1)}$ of the unit A/D conversion circuits A/DC1, A/DC2 and A/DC3 to A/DC(k−1) of the preceding steps as their input signals and accomplish the predetermined operations to produce the analog output signals $X_2$, $X_3$ to $X_{(k-1)}$ and $X_k$, the digital output signals $Y_{21}$, $Y_{31}$ to $Y_{(k-1)}$ and $Y_{k1}$, the digital output signals $Y_{20}$, $Y_{30}$ to $Y_{(k-1)0}$ and $Y_{k0}$, and the digital output signals $Y_{22}$, $Y_{32}$ to $Y_{(k-1)2}$ and $Y_{k2}$. Of these output signals, as has been described hereinbefore: the analog output signals $X_2$ and $X_3$ to $X_{(k-1)}$ are fed as the input signals of the unit A/D conversion circuits A/DC3 to A/D(k−1) and A/DCK of the subsequent steps, respectively; the digital output signals $Y_{20}$ and $Y_{30}$ to $Y_{(k-1)0}$ are fed to the delay circuits DL2 and DL3 to DL(k−1), respectively; and the digital output signal $Y_{k2}$ is fed to the addition circuit AD3(k−1).

The (k−1) number of delay circuits DL1, DL2 and DL3 to DL(k−1) delay the digital output signals $Y_{10}$, $Y_{20}$ and $Y_{30}$ to $Y_{(k-1)0}$ of the respectively corresponding (k−1) number or unit A/D conversion circuits A/DC1, A/DC2 and A/DC3 to A/DC(k−1) by one sampling period and feed the respectively suitable output signals to the (k−1) number of addition circuits AD3-1, AD3-2 and AD3-3 to AD3(k−1).

The addition circuit AD3-1 adds the output signal of the differential circuit DC2 and the output signal of the delay circuit DC1 and outputs the added output signal as the digital output signal $W_k$ of the A/D converter A/DC'. The (k−3) number of addition circuits AD3-2 and AD3-3 to AD3-(k−2) (not shown) add the output signals of the (k−3) number of differential circuits DC3 to DC(k−1) and the output signals of the (k−3) number of delay circuits DL2 and DL3 to DL(k−2) (not shown) and feed their output signals to the (k−3) number of differential circuits DC2 and DC3 to DC(k−3) (not shown), respectively. The addition circuit AD3(k−1) adds the output signal of the delay circuit DL(k−1) and the digital output signal $Y_{k2}$ and feeds the added output signal to the differential circuit DC(k−1).

The (k−2) number of differential circuits DC2 and DC3 to DC(k−1) differentiate the output signals of the (k−2) number of addition circuits AD3-2 and AD3-3 to AD3-(k−1), respectively, and feed their differentiated output signals to the (k−2) number of addition circuits AD3-1, AD3-2 and AD3-3 to AD3-(k−2) (not shown), respectively.

Incidentally, the characters $N_1$ and $N_2$ designate the quantization noise voltages, as has been described hereinbefore, and the characters $N_3$ to $N_{(k-1) \text{ and } Nk}$ likewise designate the quantization noise voltages to be added to the output signals of the voltage comparison circuit VD contained in the corresponding (k−2) number of unit A/D conversion circuits A/DC3 to A/DC(k−1) and A/DCK, respectively. The characters $Z^{-1}$ shown in the (k−1) number of delay circuits DL1, DL2 and DL3 to DL(k−1) designate the delay of one sampling period as the Z function, as has been described in connection with the aforementioned delay circuit DL1. The characters $(1-Z^{-1})$ shown in the (k−2) number of differential circuits DC2 and DC3 to DC(k−1) designate the differentiations of the signals sampled as the Z function. The digital output signal $W_k$ of the A/D converter A/DC' of the present embodiment is expressed in the form of the Z function, as follows:

$$W_K = (1 - Z^{-1})^{K-2}(Y_{K2} + Z^{-1}Y_{(K-1)0}) + \\ Z^{-1}(1 - Z^{-1})^{K-3}Y_{(K-2)0} + Z^{-1}(1 - Z^{-1})^{K-4} \\ Y_{(K-3)0} + \ldots + Z^{-1}(1 - Z^{-1})Y_{20} + Z^{-1}Y_{10} = \\ (2 - Z^{-1})X + (1 - Z^{-1})^K N_K \qquad (13)$$

It will be seen from this equation (13) like the foregoing equation (12) that the comparison with the equation (1) reveals that the order of the noise shaping coefficient $(1-Z^{-1})$ for the quantization noise voltage is more by the number of steps of the unit A/D conversion circuits if the gain of the analog input signal X, i.e., the transmission function $(2-Z^{-1})$ of the analog input signal X is unchanged.

As has been described hereinbefore, the A/D converter A/DC' of the present embodiment is enabled to attenuate the quantization noise voltage only in accordance with the step number of the unit A/D conversion circuits without any change in the gain of the signal itself by connecting the unit A/D conversion circuits in multiple states in cascade, thus realizing an A/D converter of wide band and high accuracy.

An A/D converter of wide band and high accuracy having a noise shaping coefficient of high order can be realized remarkably easily and simply merely by constructing each unit A/D conversion circuit A/DC2' or the like of the delay circuit DL2, the differential circuit DC2, the addition circuit AD3-2 and the unit A/D conversion circuit A/DC2 and by connecting them simply in a multi-stage cascade.

As described in the foregoing embodiments, the following effects can be obtained if the present invention is applied to the oversampling type A/D converter. Specifically, by constructing the oversampling type A/D converter of a multi-stage cascade connection of the unit interpolation type A/D conversion circuits, the signal bandwidth can be enlarged while retaining the interpolation type A/D conversion circuits, i.e., the advantages of the loose operating speed and accuracy for the analog elements such as the operational amplifier or the capacitors. Moreover, the digital circuits for processing the digital output signals of the unit interpolation type A/D conversion circuits are composed of the simple digital circuits such as the delay circuits, the addition circuits or the differential circuits, thus raising the effect that the A/D converter of wide band and high accuracy can be economically realized.

What is claimed is:

1. An analog/digital converter comprising:
   input means for producing a second analog signal on the basis of an analog input signal and a first analog signal produced by digital/analog conversion means;
   first integration means coupled to said input means for integrating said second analog signal to produce a third analog signal;
   analog/digital conversion means coupled to said input means and said first integration means for producing a first digital signal on the basis of said second and third analog signals;
   second integration means coupled to said analog/digital conversion means for integrating said digital signal to produce a second digital signal;

said digital/analog conversion means being coupled to said second integration means and said input means for producing said first analog signal on the basis of said second digital signal;

addition means coupled to said analog/digital conversion means and said second integration means for adding said first and second digital signals to produce a digital output signal;

a first output terminal connected to output said first digital signal;

a second output terminal connected to output a second digital signal; and a third output terminal connected to output said digital output signals.

2. An analog/digital converter comprising:

a first conversion unit including first input means for producing a second analog signal on the basis of an analog input signal and a first analog signal produced by first digital/analog conversion means, first integration means coupled to said first input means for integrating said second analog signal to produce a third analog signal, first analog/digital conversion means coupled to said first input means and said first integration means for producing a first digital signal on the basis of said second and third analog signals, second integration means coupled to said first analog/digital conversion means for integrating said first digital signal to produce a second digital signal, said first digital/analog conversion means being coupled to said second integration means and said first input means for producing said first analog signal on the basis of said second digital signal, and means coupled to said first analog/digital conversion means and said second integration means for producing a third digital signal on the basis of said first and second digital signals;

a second conversion unit including second input means coupled to said first analog/digital conversion circuit for producing a fifth analog signal on the basis of said third analog signal and a fourth analog signal produced by second digital/analog conversion means, third integration means coupled to said input means for integrating said fourth analog signal to produce a sixth analog signal, second analog/digital conversion means coupled to said second input means and said third integration means for producing a fourth digital signal on the basis of said fifth and sixth analog signals, fourth integration means coupled to said second analog/digital conversion means for integrating said fourth digital signal to produce a fifth digital signal, and said second digital/analog conversion means being coupled to said fourth integration means and said second input means for producing said fourth analog signal on the basis of said fifth digital signal; and output means coupled to said first and second conversion units for producing a digital output signal on the basis of said third and fourth digital signals.

3. An analog/digital converter according to claim 2, wherein said output means includes delay means for delaying said third digital signal for a predetermined period.

4. An analog/digital converter according to claim 3, wherein said output means further includes first addition means for adding said fourth digital signal and the third digital signal delayed by said delay means, to produce a digital output signal.

5. An analog/digital converter according to claim 4, wherein said first analog/digital conversion means includes second addition means for adding said second and third analog signals, first comparison means for comparing the added output of said addition means with a predetermined first reference point and first logical means for producing said first digital signal on the basis of the compared output of said first comparison means, and wherein said second analog/digital conversion means includes third addition means for adding said fifth and sixth analog signals, second comparison means for comparing the added output of said third addition means with a predetermined second reference point, and second logical means for producing said fourth digital signal on the basis of the compared output of said second comparison means.

6. A semiconductor integrated circuit formed over a single chip, comprising:

analog/digital converter for converting an analog input signal to a digital output signal;

a decimator circuit coupled to said analog/digital converter for decimating said digital output signal in accordance with a timing signal; and a digital signal processor coupled to said decimator circuit, wherein said analog/digital converter includes:

a first conversion unit including first input means for producing a second analog signal on the basis of said analog input signal and a first analog signal produced by first digital/analog conversion means, first integration means coupled to said first input means for integrating said second analog signal to produce a third analog signal, first analog/digital conversion means coupled to said first input means and said first integration means for producing a first digital signal on the basis of said second and third analog signals, second integration means coupled to said first analog/digital conversion means for integrating said first digital signal to produce a second digital signal, said first digital/analog conversion means being coupled to said second integration means and said first input means for producing said first analog signal on the basis of said second digital signal, and means coupled to said first analog/digital conversion means and said second integration means for producing a third digital signal on the basis of said first and second digital signals;

a second convertion unit including second input means coupled to said first analog/digital conversion circuit for producing a fifth analog signal on the basis of said third analog signal and a fourth analog signal produced by second digital/analog conversion means, third integration means coupled to said second input means for integrating said fourth analog signal to produce a sixth analog signal, second analog/digital conversion means coupled to said second input means and said third integration means for producing a fourth digital signal on the basis of said fifth and sixth analog signals, fourth integration means coupled to said second analog/digital conversion means for integrating said fourth digital signal to produce a fifth digital signal, and said second digital/analog conversion means being coupled to said fourth integration means and said second input means for producing said fourth analog signal on the basis of said fifth digital signal; and output means coupled to said first and second conversion units for producing said digital output signal on the basis of said third and fourth digital signals.

7. A semiconductor integrated circuit according to claim 6, wherein said output means includes delay means for delaying said third digital signal for a predetermined period.

8. A semiconductor integrated circuit according to claim 7, wherein said output means further includes first addition means for adding said fourth digital signal and the third digital signal delayed by said delay means, to produce a digital output signal.

9. A semiconductor integrated circuit according to claim 8, wherein said first analog/digital conversion means includes second addition means for adding said second and third analog signals, first comparison means for comparing the added output of said first addition means with a predetermined first reference point, and first logical means for producing said first digital signal on the basis of the compared output of said first comparison means, and wherein said second analog/digital conversion means includes third addition means for adding said fifth and sixth analog signals, second comparison means for comparing the added output of said third addition means with a predetermined second reference point, and second logical means for producing said fourth digital signal on the basis of the compared output of said second comparison means.

10. An analog/digital converter comprising:

a plurality of analog/digital conversion units, each unit comprising input means for producing a second analog signal in the basis of an analog input signal and a first analog signal produced by digital-/analog conversion means, first integration means coupled to said input means for integrating said second analog signal to produce a third analog signal, analog/digital conversion means coupled to said input means and said first integration means for producing a first digital signal on the basis of said second and third analog signals, second integration means coupled to said analog/digital conversion means for integrating said first digital signal to produce a second digital signal wherein said digital/analog conversion means coupled to said second integration means and said input means for producing said first analog signal on the basis of said second digital signal, an addition circuit coupled to said analog/digital conversion means and said second integration means for adding said first and second digital signals to produce a digital output signal, first output terminal for outputting said first digital signal, second output terminal for outputting said second digital signal and third output terminal for outputting said digital output signal;

means for supplying said third analog signal of first analog/digital convertion unit to said input means of second analog/digital convertion unit as said analog input signal thereof;

means for supplying said third analog signal of said second analog/digital convertion unit to said input means of third analog/digital convertion unit as said analog input signal thereof;

first and second delay means for delaying each digital output signal of said first and second analog/digital convertion units respectively;

first addition means for adding an output signal of said first delay means and an output signal of a differential circuit and feeding an output signal of said analog/digital converter; and second addition means for adding an output signal of said second delay means and a signal based on said first digital signal of third analog/digital convertion unit and feeding an input signal.

11. A first-form-to-second-form signal converter comprising: input means for producing a second signal of said first form on the basis of an input signal of said first form and a first signal of said first form produced by second-form-to-first-form signal conversion means;

first integration means coupled to said input means for integrating said second signal of said first form to produce a third signal of said first form;

first-form-to-second-form signal conversion means coupled to said input means and said first integration means for producing a first signal of said second form on the basis of said second and third signals of said first form;

second integration means coupled to said first-form-to-second form-signal conversion means for integrating said first signal of said second form to produce a second signal of said second form; said second-form-to-first form signal conversion means coupled to said second integration means and said input means for producing said first signal of said first form on the basis of said second signal of said second form;

addition means coupled to said first-form-to-second-form signal conversion means and said second integration means for adding said first and second signals of said second form to produce an output signal of said second form;

first output terminal for outputting said first signal of said second form;

second output terminal for outputting said second signal of said second form; and third output terminal for outputting said output signal of said second form.

* * * * *